United States Patent [19]
Oshikawa

[11] Patent Number: 6,080,205
[45] Date of Patent: Jun. 27, 2000

[54] SEMICONDUCTOR WAFER SERVING AS MASTER-SLICE WITH BUILT-IN ADDITIONAL CURRENT DRIVERS FOR SEMI-CUSTOM-MADE INTEGRATED CIRCUIT DEVICE

[75] Inventor: Yoshihiro Oshikawa, Kanagawa, Japan

[73] Assignee: NEC Corporation, Tokyo, Japan

[21] Appl. No.: 08/996,040

[22] Filed: Dec. 22, 1997

[30] Foreign Application Priority Data

Dec. 26, 1996 [JP] Japan .................................... 8-347814

[51] Int. Cl.[7] ......................... G06F 17/50; H01L 27/118
[52] U.S. Cl. ............................... 716/8; 716/17; 716/16; 326/38; 326/40; 326/41; 326/47; 327/108
[58] Field of Search .................... 395/500.02–500.22; 326/37–50, 80–92; 327/108–112; 716/1–21

[56] References Cited

U.S. PATENT DOCUMENTS

| | | | |
|---|---|---|---|
| 4,140,921 | 2/1979 | Balasubramanian et al. | 326/44 |
| 4,727,266 | 2/1988 | Fujii et al. | 326/27 |
| 4,949,275 | 8/1990 | Nonaka | 395/500.18 |
| 5,220,216 | 6/1993 | Woo | 326/50 |
| 5,341,041 | 8/1994 | El Gamal | 326/44 |
| 5,552,721 | 9/1996 | Gould | 326/39 |
| 5,986,468 | 11/1999 | Chan et al. | 326/40 |
| 6,002,268 | 12/1999 | Sasaki et al. | 326/41 |

FOREIGN PATENT DOCUMENTS

| | | | |
|---|---|---|---|
| 5-268051 | 10/1993 | Japan | H03K 19/0175 |
| 6-195148 | 7/1994 | Japan | G06F 1/10 |

*Primary Examiner*—Paul R. Lintz
*Assistant Examiner*—Phallaka Kik
*Attorney, Agent, or Firm*—Foley & Lardner

[57] ABSTRACT

A master-slice for semi-custom-made integrated circuit devices includes standard cells arranged in rows and columns, and the standard cells are respectively associated with additional signal drivers; when logical inconsistency takes place between results of a back annotation and results of LSI tests due to time delay during propagation of signal lines, the additional signal drivers are selectively connected to the signal drivers of the standard cells so as to increase the current driving capability, thereby making the results of the LSI tests consistent with the results of the back annotation.

11 Claims, 14 Drawing Sheets

SEMICONDUCTOR WAFER SERVING AS MASTER-SLICE WITH BUILT-IN ADDITIONAL CURRENT DRIVERS FOR SEMI-CUSTOM-MADE INTEGRATED CIRCUIT DEVICE

FIELD OF THE INVENTION

This invention relates to a semiconductor wafer serving as a master-slice for semi-custom-made integrated circuit devices and, more particularly, to a semiconductor wafer serving as a master-slice having additional current drivers for changing current driving capability of internal circuits.

DESCRIPTION OF THE RELATED ART

A manufacturer assumes signal delay, and carries out a simulation before a design work for the layout of a master-slice gate array. After the design work for the layout of the master-slice gate array, the manufacturer calculates actual signal delay on the basis of the capacitance coupled to the wiring and the resistance of the wiring, and carries out a simulation, again. The simulation after the design work for the layout is called as "back annotation".

If the back annotation results in inconsistency between the simulation results and the expected logical values without timing error, the manufacturer evaluates the gate array with an LSI (Large Scale Integration) tester. The signal delay in the design work is different from the signal delay on the LSI tester or the signal delay on the actual gate array. There is a possibility that the inconsistency resulted from the difference in signal delay. The manufacturer redesigns the gate array so as to accelerate the signal propagation. One of the reasons for the difference is a cross talk between the wiring strips, and the cross talk becomes serious for the signals propagated through the wiring strips arranged at a narrow pitch. Another reason for the difference is the dispersion of the characteristics between products. However, the cross talk and the dispersion are not taken into account in the simulation before the layout design and the back annotation. If the manufacturer takes those factors into account, the design work is prolonged, and the semi-custom-made integrated circuit device is hardly completed within the expected time period.

FIG. 1 illustrates a typical example of the circuit causative of the inconsistency. The circuit is fabricated on the prior art gate array. A D flip-flop circuit 1 has a signal input node 1a, a clock node 1b and a signal output node 1c. An inverter 2 is connected through a signal line 3 to the signal input node 1a, and another inverter 4 is connected through a signal line 5 to the clock node 1b. The signal line 3 is bent several times, and passes over another signal line 6. As a result, the signal line 3 crosses the signal line 6 six times, and extends parallel to the signal line 6 twice.

The inverter 2 supplies an input data signal Din through the signal line 3 to the signal input node 1a, and the inverter 4 supplies a clock signal CLK to the clock node 1b. The D flip flop 1 is responsive to the clock signal CLK so as to latch the potential level of the input data signal Din. The D flip flop supplies an output data signal Dout representative of the potential level latched therein to a signal line 7.

In reference to FIG. 2, assume that the input data signal Din was changed to a high level at time t1 in the back annotation, and the D flip flop 1 latched the high level in response to the clock signal at time t2. For this reason, the output data signal was changed from the low level to the high level at time t2 as indicated by plots PL2. However, when the circuit is subjected to the LSI test, the input data signal Din is affected by the signal line 6, and is delayed as indicated by plots PL3. The input data signal Din remains low at time t2, and the output data signal Dout is maintained at the low level as indicated by plots PL4. Although the output data signal Dout is expected to be in the high level after time t2, the D flip flop 1 maintains the actual output data signal Dout at the low level, and inconsistency takes place between the back annotation and the LSI test result.

When the manufacturer finds the inconsistency, the manufacturer redesigns the circuit as shown in FIG. 3. The manufacturer connects another inverter 8 in parallel to the inverter 2 so as to cancel the influence of the signal line 6. The inverter 8 increases the current driving capability for the input data signal Din, and the input data signal Din in the circuit shown in FIG. 3 reaches the threshold of the D flip flop circuit 1 earlier than the input data signal Din of the circuit shown in FIG. 1. As a result, the D flip flop circuit 1 changes the logic level at time t2, and the logic level of the output data signal Dout is consistent with the expected logic level.

FIG. 4 illustrates the prior art master-slice for gate arrays. Standard cells 10 are simply arranged in rows and columns on the master slice 11, and signal lines are never formed between the standard cells 10. The manufacturer tailors signal lines between the standard cells after receipt of the design specification of a customer, and completes a semi-custom-made integrated circuit device. For this reason, the redesign work is not easy, and consumes a large amount of time and labor.

A solution is proposed in Japanese Patent Publication of Unexamined Application No. 6-195148. FIG. 5 illustrates another prior art semiconductor integrated circuit device disclosed in the Japanese Patent Publication of Unexamined Application. The prior art semiconductor integrated circuit device includes a clock generator 21 and a selector 22 connected to the clock generator 21. The clock generator 21 produces a clock signal CLK and the complementary clock signal CCLK from a system clock CK, and the selector 22 selectively supplies control signals C(Q)/ C(XQ), B(Q)/ B(XQ) and A(Q)/ A(XQ) to the clock generator 21 so as to match the two-phase clock signal CLK/CCLK with a load (not shown). The time delay between the two-phase clock signal CLK/CCLK and the control signals C(Q)/ C(XQ), B(Q)/ B(XQ) and A(Q)/ A(XQ) falls within a predetermined range. Though not shown in FIG. 5, a plurality of clock generating circuits different in driving capability are incorporated in the clock generator 21, and the selector 22 selectively activates the plurality of clock generating circuits for a given load. This means that the other clock generating circuits are left non-selected, and the prior art semiconductor integrated circuit device requires additional area for the non-selected clock generating circuits, and is uneconomical. Japanese Patent Publication of Unexamined Application No. 6-195148 is silent to any semi-custom-made integrated circuit device, and never teaches how to apply it to a semiconductor wafer serving as a master-slice for semi-custom-made integrated circuit devices. Especially, the clock generator 21 actually drive the load coupled thereto.

SUMMARY OF THE INVENTION

It is therefore an important object of the present invention to provide a semiconductor wafer serving as a master-slice for semi-custom-made integrated circuit devices which allows a manufacturer to exactly confirm designed logical functions through LSI tests.

To accomplish the object, the present invention proposes to selectively increase the current driving capability of standard cells so as to cancel time delay due to propagation of a signal.

In accordance with one aspect of the present invention, there is provided a semiconductor wafer serving as a master-slice for semi-custom-made integrated circuit devices comprising a plurality of standard cells available for forming an integrated circuit and having respective signal drivers, a plurality of additional signal drivers respectively associated with the plurality of standard cells and having respective input signal lines connected to signal input nodes of the signal drivers of the plurality of standard cells and respective output signal lines connected to signal output nodes of the signal drivers, and a peripheral circuit selectively activating the plurality of additional current drivers so that selected additional current drivers cooperate with the associated signal drivers.

BRIEF DESCRIPTION OF THE DRAWINGS

The features and advantages of the semiconductor wafer serving as a master-slice will be more clearly understood from the following description taken in conjunction with the accompanying drawings in which.

DESCRIPTION OF THE PREFERRED EMBODIMENTS

First Embodiment

Figure 1:
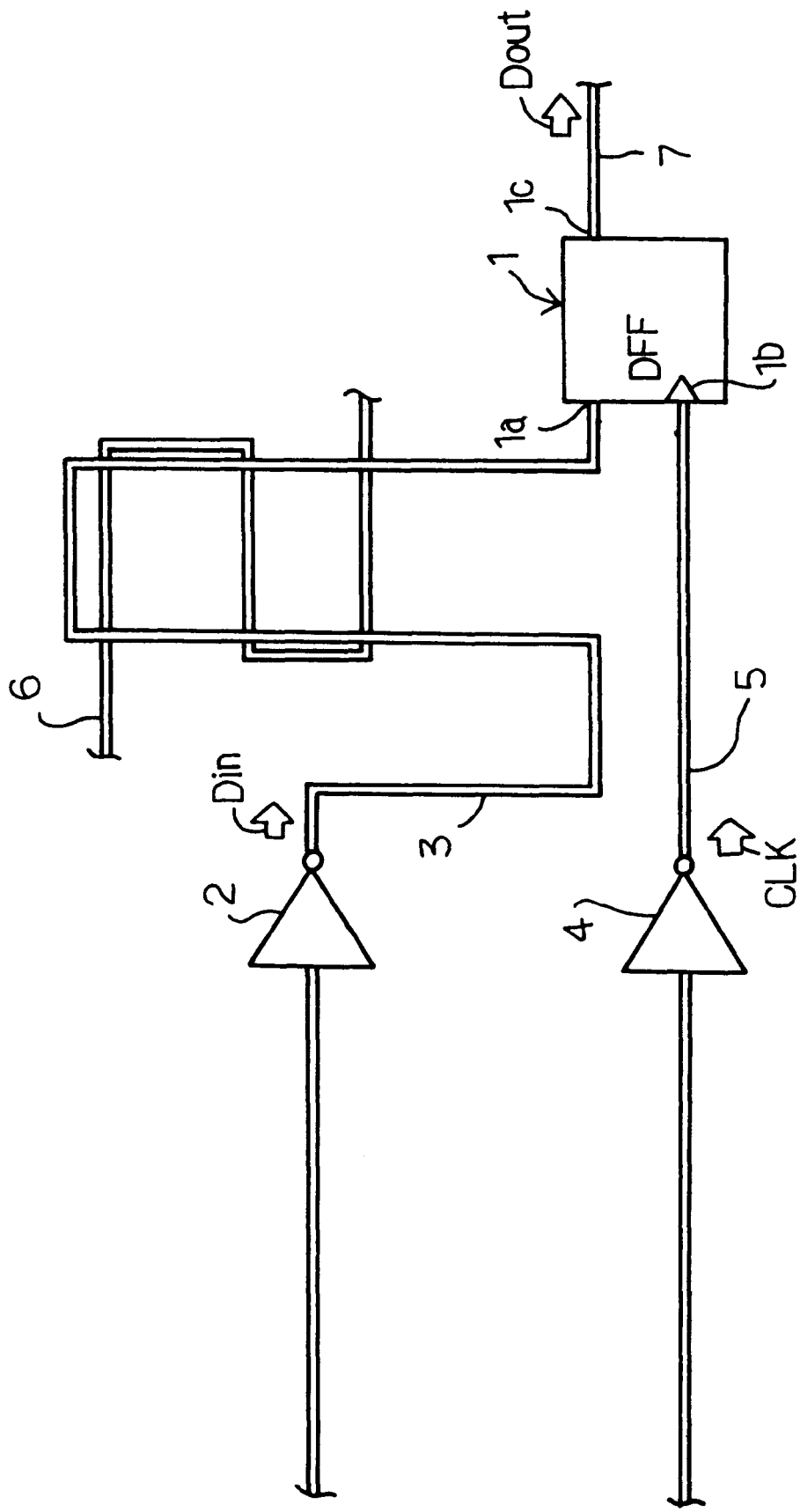
FIG. 1 is a circuit diagram showing the typical circuit configuration fabricated on the prior art gate array.
Figure 2:
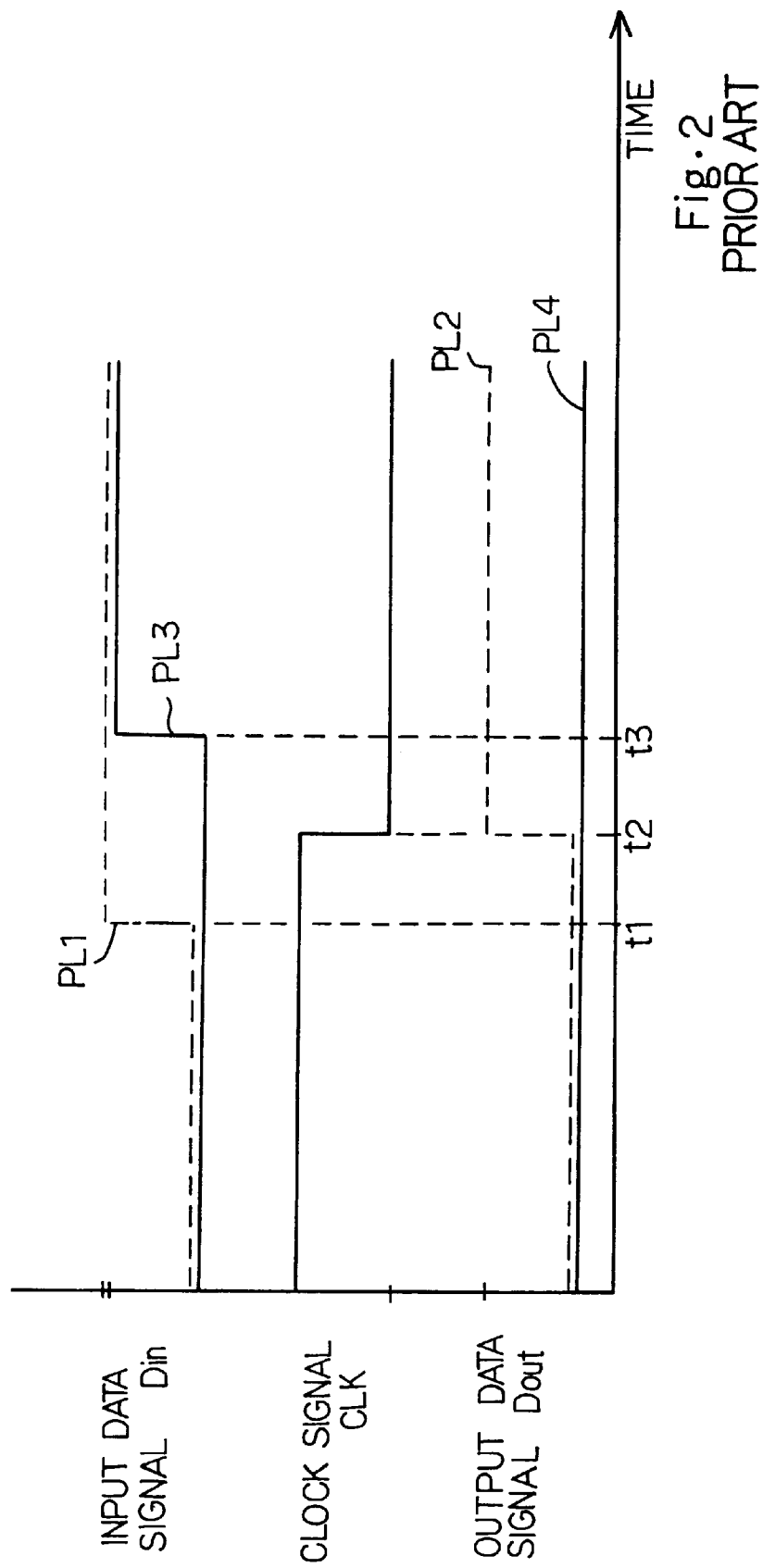
FIG. 2 is a timing chart showing the inconsistency between the simulation results and the test results.
Figure 3:
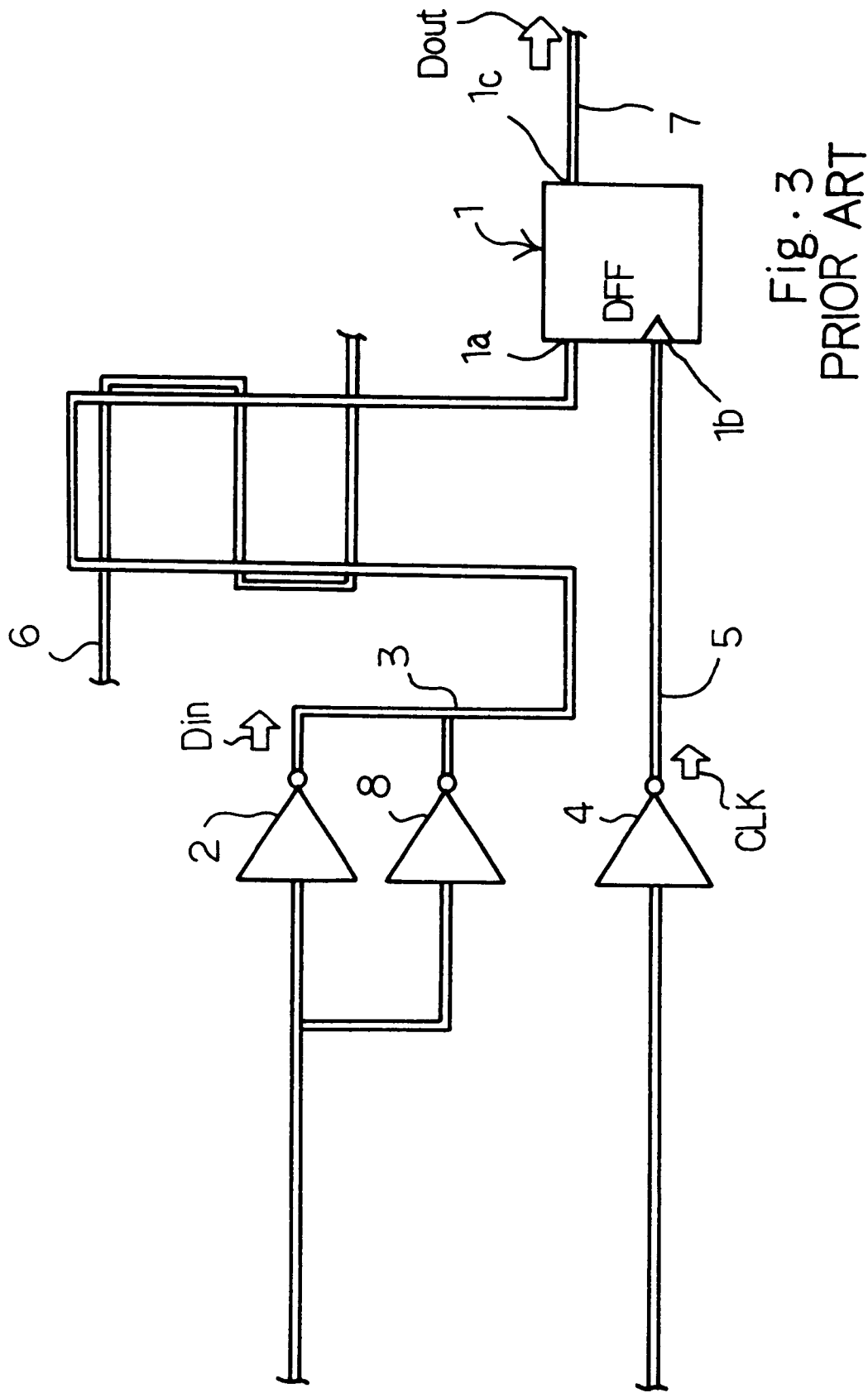
FIG. 3 is a circuit diagram showing the circuit redesigned for eliminating the inconsistency.
Figure 4:
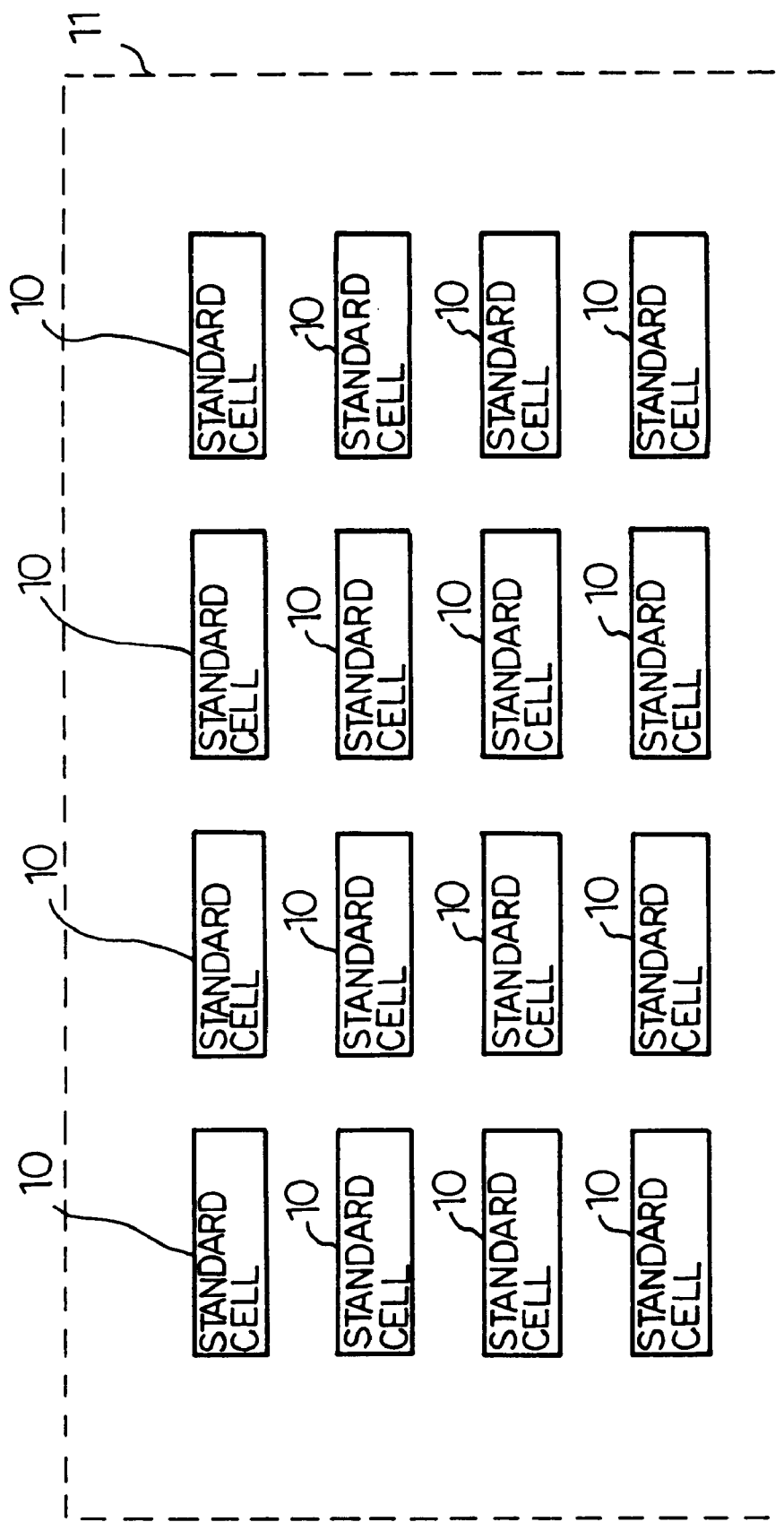
FIG. 4 is a plan view showing the layout of cell blocks incorporated in the prior art gate array.
Figure 5:
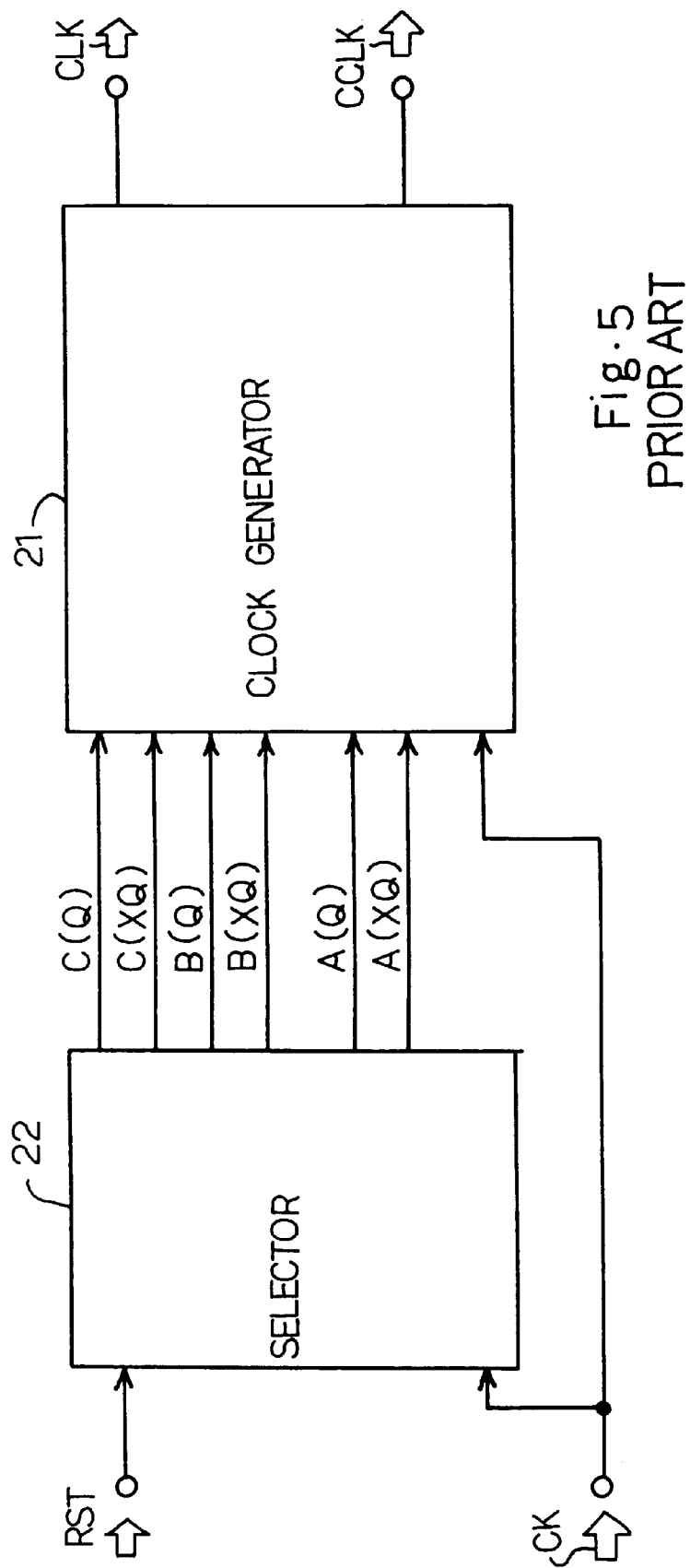
FIG. 5 is a block diagram showing the arrangement of the prior art semiconductor integrated circuit device disclosed in Japanese Patent Publication of Unexamined Application No. 6-195148.
Figure 6:
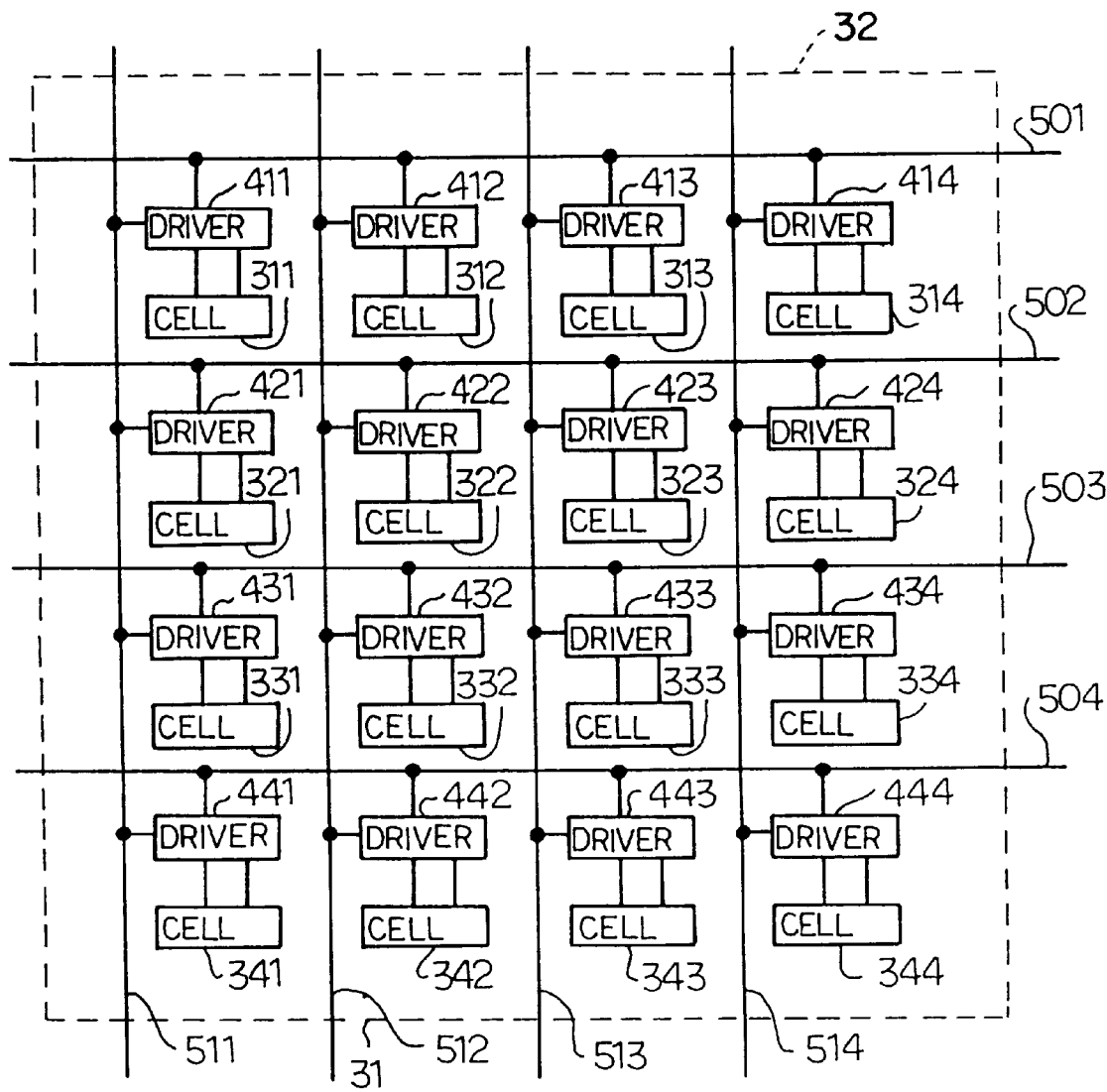
FIG. 6 is a plan view showing an internal cell area of a semiconductor wafer assigned to a standard cell array.

Referring first to FIG. 6 of the drawings, an internal cell area 31 of a semiconductor wafer is assigned to a standard cell array 32, and the semiconductor wafer serves as a master-slice embodying the present invention for various semi-custom-made integrated circuit devices. A plurality of standard cells 311–314, 321–324, 331–334, 341–344 are arranged in rows and columns, and are respectively associated with a plurality of additional current drivers 411–414, 421–424, 431–434, and 441–444. The standard cells 311–344 are respectively connected to the associated additional current drivers 411–444. Selecting signal lines 501, 502, 503 and 504 are respectively connected to the rows of additional current drivers 411–414, 421–424, 431–434, 414–444, and write-in signal lines 511, 521, 513 and 514 are connected to the columns of additional current drivers 411–441, 412–442, 413–443, 414–444, respectively. Thus, the additional current drivers 411 to 444, the selecting signal lines 501–504 and the write-in signal lines 511–514 have been already provided in the internal cell area 31 together with the standard cells 311 to 344 before metallization.

Figure 7:
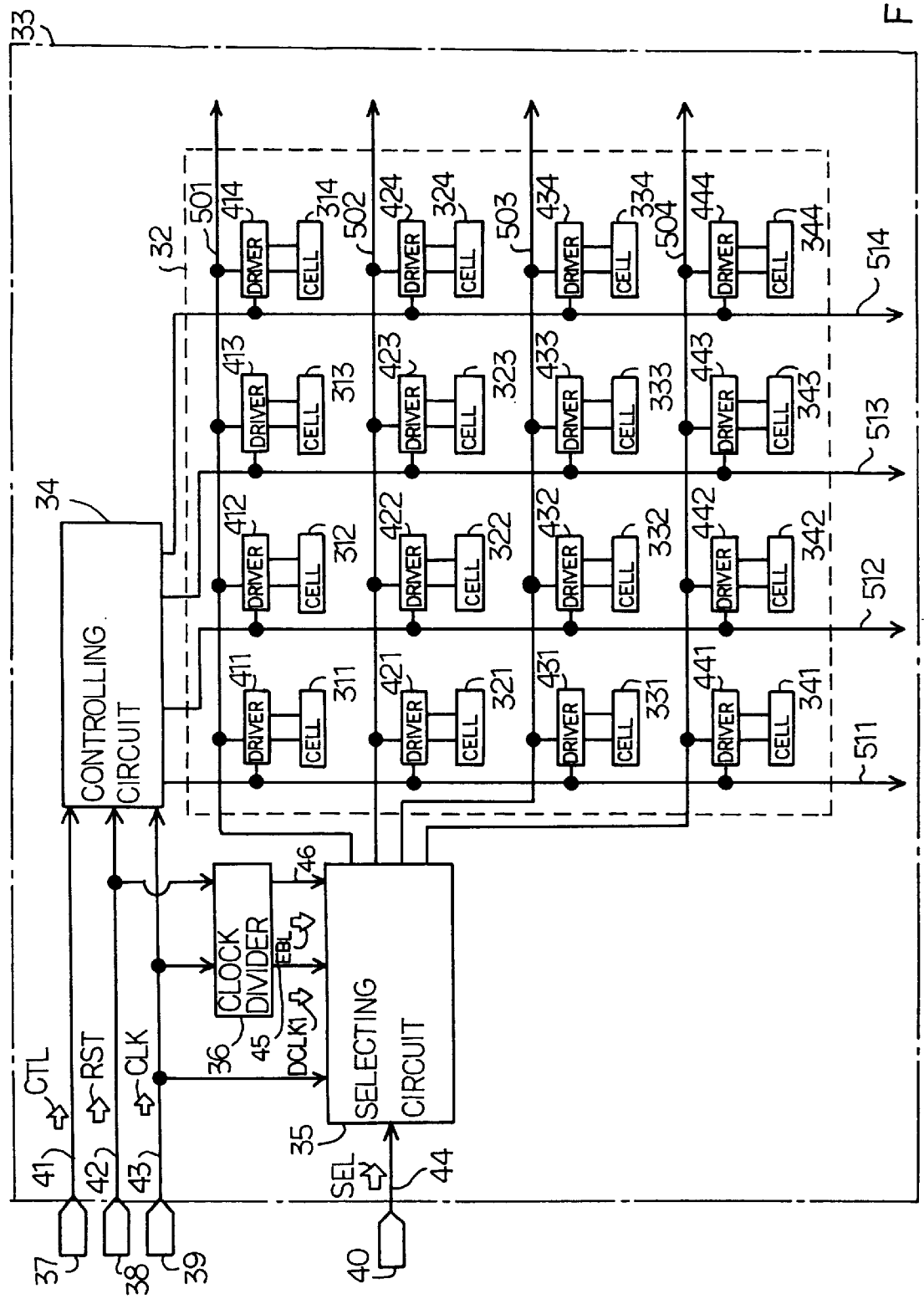
FIG. 7 is a block diagram showing the circuit arrangement of a gate array fabricated on the semiconductor wafer serving as a master-slice according to the present invention.

FIG. 7 illustrates a gate array fabricated on the semiconductor wafer 33. A controlling circuit 34, a selecting circuit 35 and a clock divider 36 are fabricated on the semiconductor wafer 33 together with the standard cell array 32, the additional current drivers 411 to 444, the selecting signal lines 501 to 504 and the write-in signal lines 511 to 514, and signal terminals 37, 38, 39 and 40 are provided on the semiconductor wafer 33. The signal terminals 37 to 39 are connected through signal lines 41, 42 and 43 to the controlling circuit 34, and the signal lines 41, 42 and 43 propagate a control signal CTL, a reset signal RST and a clock signal CLK to the controlling circuit 34. The signal terminal 40 is connected through a signal line 44 to the selecting circuit 35, and the signal line 44 propagates a selecting signal SEL to the selecting circuit 35. The signal line 42 is branched so as to propagate the reset signal RST to the clock divider 36, and the signal line 43 is branched so as to supply the clock signal to the clock divider 36 and the selecting circuit 35. The clock divider 36 is connected through signal lines 45 and 46 to the selecting circuit 35, and supplies a divided clock signal DCLK1 and an enable signal EBL through the signal lines 45/46 to the selecting circuit 35. The divided clock signal DCLK1 has a pulse interval twice as long as the pulse interval of the clock signal CLK. The selecting circuit 35 is connected to the selecting signal lines 501 to 504 so as to selectively drive the selecting signal lines 501 to 504, and the controlling circuit 34 is connected to the write-in signal lines 511 to 514.

Figure 8:
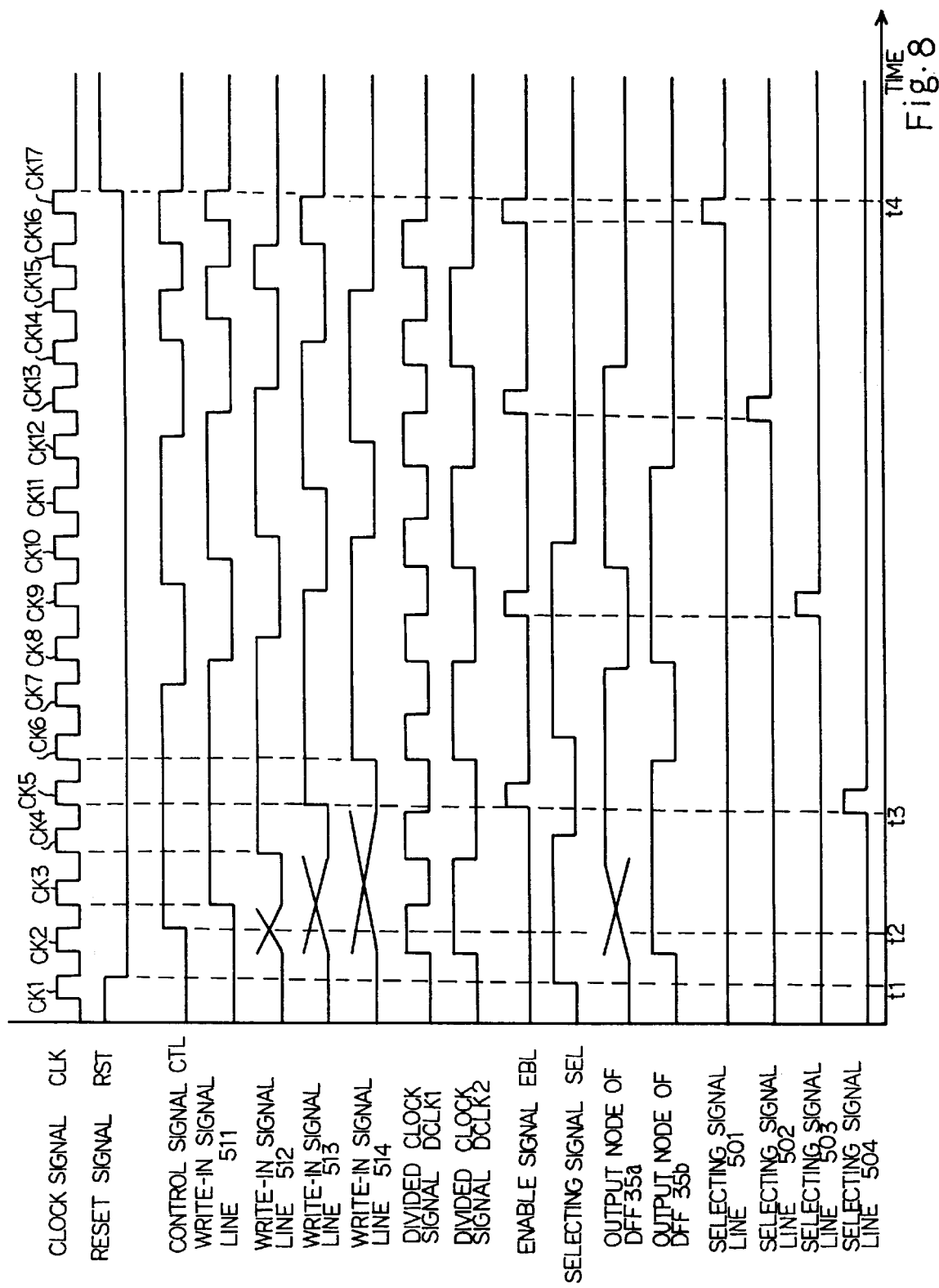
FIG. 8 is a timing chart showing the circuit behavior of the gate array.

FIG. 8 illustrates the signals CTL, RST, CLK, DCLK1, EBL and SEL and the behavior of the controlling/selecting circuits 34/35. Assuming now that a semi-custom-made integrated circuit device had been designed on the basis of the gate array shown in FIG. 7, the manufacturer confirmed the logical consistency through back annotation. However, a logical inconsistency takes place in the LSI test, and the manufacturer decided to change the current driving capability of a function block. The control signal CTL is supplied through the signal terminal 37 to the controlling circuit 34, and the control circuit 34 sequentially changes the write-in signal lines 511 to 514 to the high level.

On the other hand, the selecting signal SEL is supplied through the signal terminal 40 to the selecting circuit 35, and the clock signal CLK, the divided clock signal DCLK1 and the enable signal EBL are further supplied to the selecting circuit 35. The selecting circuit 35 decodes the selecting signal SEL, and selectively changes the selecting signal lines 501 to 504 specified by the selecting signal SEL to the high level. The write-in signal line 511/512/513/514 and the selecting signal line 501/502/503/504 select one of the additional current drivers 411 to 444.

Figure 9:
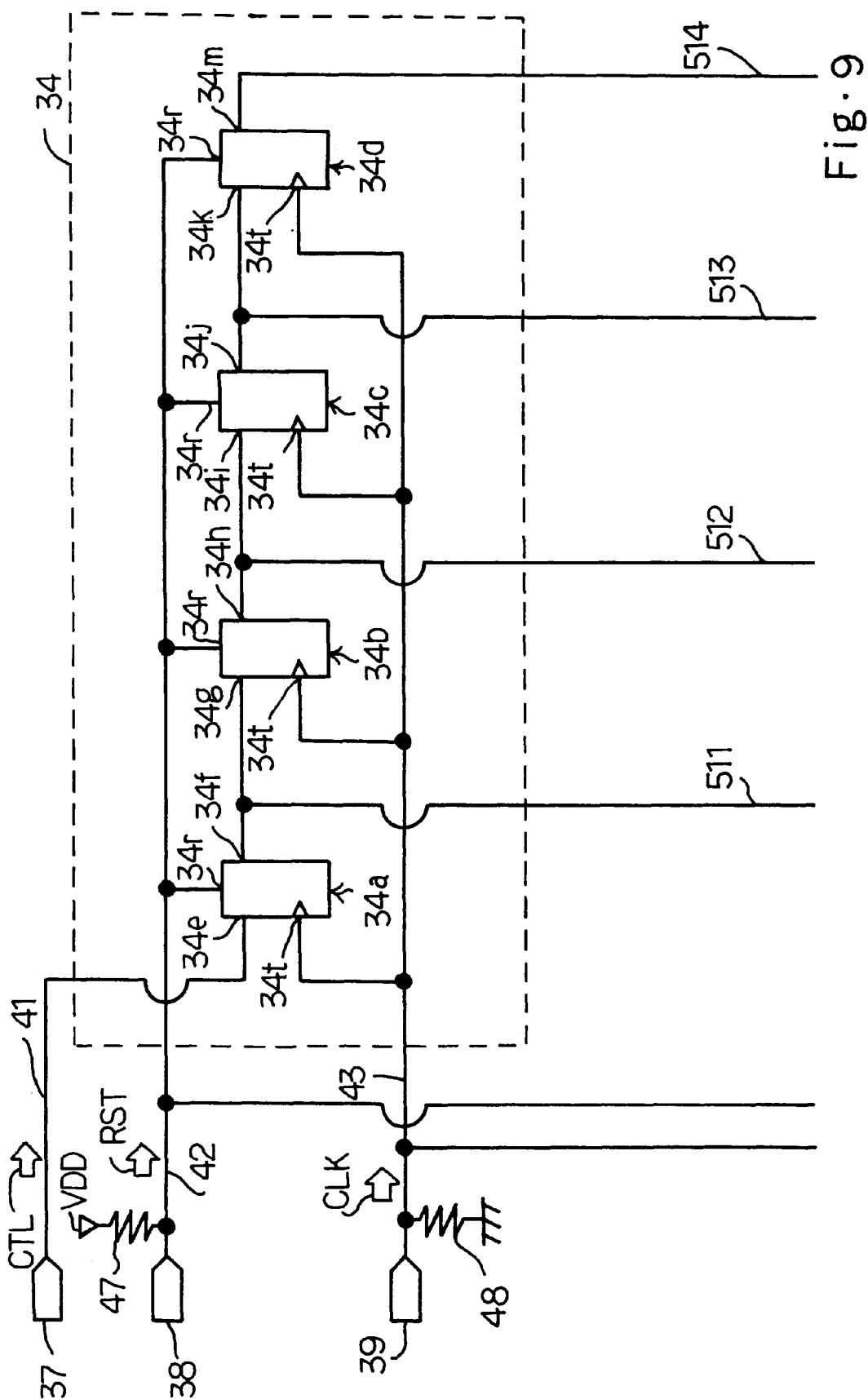
FIG. 9 is a circuit diagram showing the circuit configuration of a controlling circuit incorporated in the gate array.

FIG. 9 illustrates the circuit configuration of the controlling circuit 34. A pull-up resistor 47 is connected between a power supply line VDD and the signal line 42, and a pull-down resistor 48 is connected between the signal line 43 and a ground line 48. The controlling circuit 34 includes D (Delayed) flip flop circuits 34a, 34b, 34c and 34d connected in cascade, and the write-in signal lines 511 to 514 are connected to the signal output nodes of the D flip flop circuits 34a to 34d, respectively. The signal terminal 37 is connected through the signal line 41 to the signal input node 34e of the D flip flop circuit 34a, and the signal output nodes 34f, 34h, 34j of the D flip flop circuits 34a to 34c are respectively connected to the signal input nodes 34g, 34i, 34k of the next D flip flop circuits 34b to 34d. The signal terminal 38 is connected through the signal line 42 to the reset nodes 34r of all the D flip flop circuits 34a to 34d, and the signal terminal 39 is connected through the signal line 43 to the clock nodes 34t of the flip flop circuits 34a to 34d.

The controlling circuit 34 behaves as follows. The reset signal RST goes down to the low level before the second clock pulse CK2 (see FIG. 8), and the control signal CTL rises after the fall of the second clock pulse CK2. The first D flip flop circuit 34a latches the control signal CTL at the leading edge of the third clock pulse CK3, and changes the write-in signal line 511 to the high level. The high level at the signal output node 34f is latched by the second D flip flop circuit 34b at the leading edge of the fourth clock pulse CK4, and the second D flip flop circuit 34b changes the write-in signal line 512 to the high level. In this way, the write-in signal lines 511 to 514 are sequentially changed to the high level at the third clock pulse CK3 to the sixth clock pulse CK6. The control signal CTL is changed to the low level after the seventh clock pulse CK7, and the write-in signal lines 511 to 514 sequentially goes down to the low level. Thus, the controlling circuit 34 sequentially changes the write-in signal lines 511 to 514 between the high level and the low level in response to the clock signal CLK.

Figure 10:
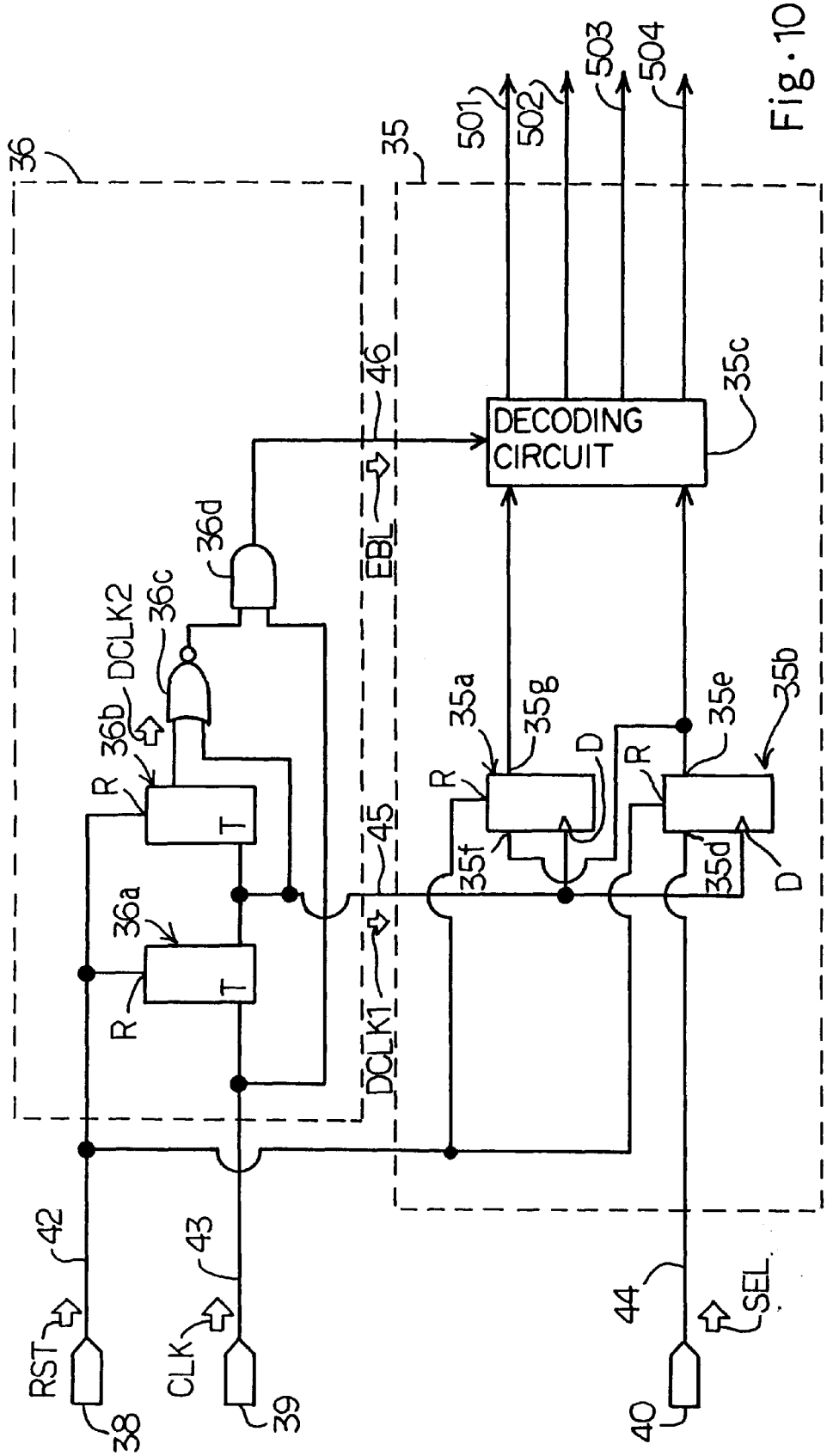
FIG. 10 is a circuit diagram showing the circuit configuration of a clock divider and the circuit configuration of a selecting circuit both incorporated in the gate array.

FIG. 10 illustrates the circuit configuration of the clock divider 36 and the selecting circuit 35. The clock divider 36 includes T (Trigger) flip flop circuits 36a/36b, a NOR gate 36c and an AND gate 36d. The signal terminal 38 is connected through the signal line 42 to the reset nodes R of the T-flip flop circuits 36a/36b, and the signal terminal 39 is connected through the signal line 43 to the clock node T of the T-flip flop circuit 36a. The data output node of the T-flip flop circuit 36a is connected to the clock node T of the T-flip flop circuit 36b, and is further connected to the signal line 45. The T-flip flop 36a changes the output data node between the low level and the high level at the leading edge of every clock pulse, and the pulse interval of the divided clock signal DCLK1 is twice as wide as the clock signal CLK.

The data output node of the T flip flop circuit 36a is further connected to the first input node of the NOR gate 36c, and the data output node of the T flip flop circuit 36b is connected to the other input node of the NOR gate 36c. The output node of the NOR gate 36c is connected to the first input node of the AND gate 36d, and the clock signal CLK is supplied to the other input node of the AND gate 36d. The T flip flop circuit 36b generates a divided clock signal DCLK2 at the data output node thereof, and the divided clock signal DCLK2 is twice as wide in pulse interval as the divided clock signal DCLK1 (see FIG. 8). The NOR gate 36c is enabled with the divided clock signal DCLK2 of the low level, and changes the output node thereof to the high level after the fall of the divided clock signal DCLK1. The high level at the output node of the NOR gate 36c is ANDed with the clock signal CLK of the high level so as to change the enable signal EBL to the high level.

For example, the divided clock signal DCLK2 goes down to the low level at the clock pulse CK4 (see FIG. 8), and the NOR gate 36c is enabled with the divided clock signal DCLK2 of the low level. The divided clock signal DCLK1 is changed to the low level at the clock pulse CK5, and the AND gate concurrently changes the enable signal EBL to the high level.

The selecting circuit 35 includes two D flip flop circuits 35a/35b and a decoding circuit 35c. The signal terminal 40 is connected through the signal line 44 to the data input node 35d of the D flip flop circuit 35b, and the data output node 35e of the D flip flop circuit 35b is connected to the data input node 35f of the D flip flop circuit 35a. The signal line 45 is connected to the clock nodes D of the D flip flop circuits 35a/35b, and the signal terminal 39 is connected through the signal line 43 to the reset nodes R of the D flip flop circuits 35a/35b. The data output nodes 35e/35g of the D flip flop circuits 35a/35b are connected in parallel to the decoding circuit 35c, and the enable signal EBL is supplied to the decoding circuit 35c.

The D flip flop circuits 35a/35b change the potential levels at the output data nodes 35g/35e in response to the divided clock signal DCLK1, and the decoding circuit 35c sequentially changes the selecting signal lines 504, 503, 502, 501 in response to the enable signal EBL as shown in FIG. 8.

Figure 11:
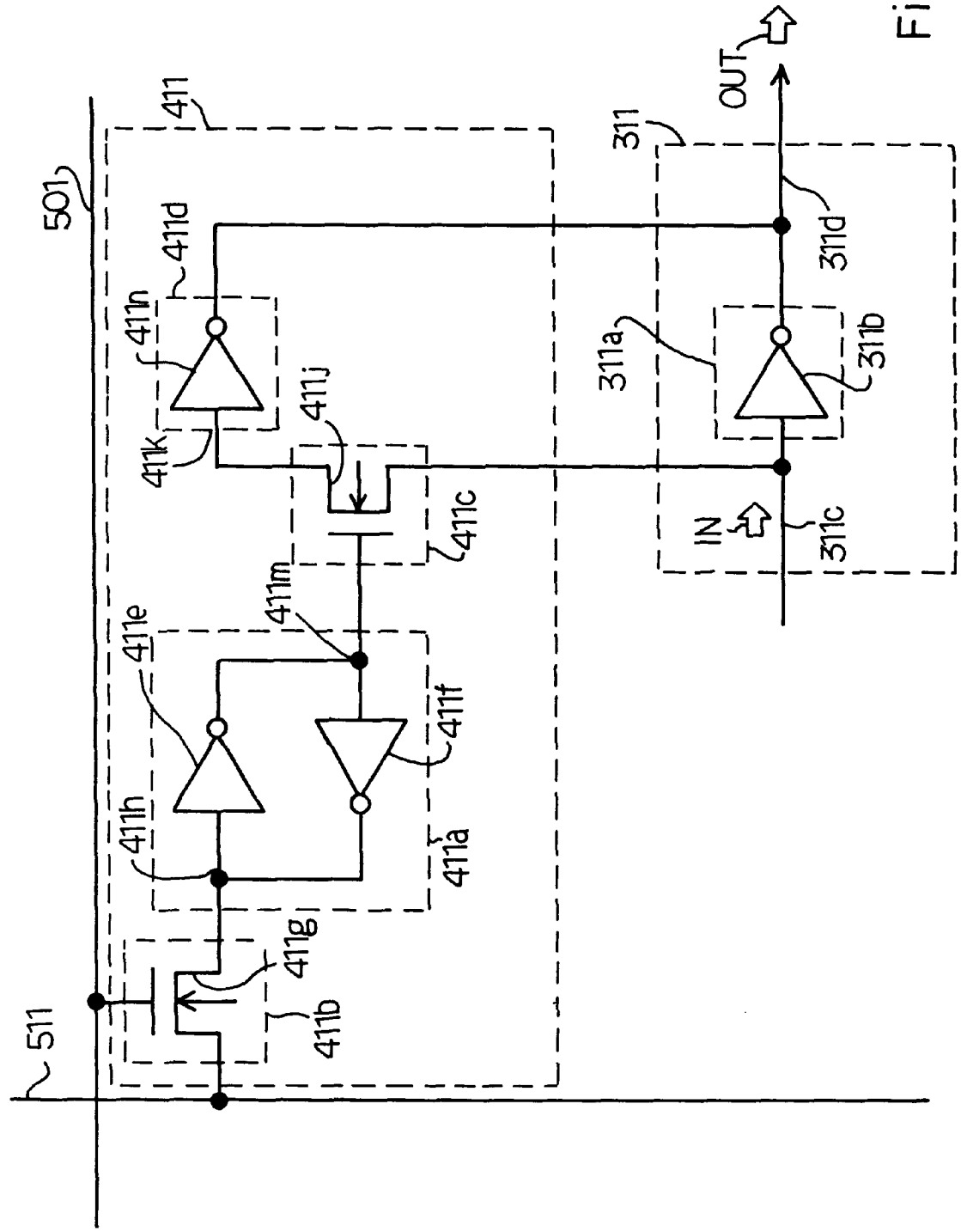
FIG. 11 is a circuit diagram showing the circuit configuration of a variable current driver incorporated in the gate array.

FIG. 11 illustrates the circuit configuration of one of the additional current drivers 411 to 444. The additional current drivers 411 to 444 are similar in circuit configuration to one another, and the additional current driver shown in FIG. 11 is assumed to be the additional current driver 411. The additional current driver 411 is associated with the standard cell 311, and the standard cell 311 includes a current driving circuit 311a implemented by an inverter 311b. An input signal IN is supplied from an internal signal line 311c to the input node of the inverter 311b, and the inverter 311b supplies an output signal OUT to a internal signal line 311d.

The additional current driver 411 includes a memory circuit 411a, a switching unit 411b, a switching unit 411c and an additional driving circuit 411d. The memory circuit 411a is implemented by inverters 411e/411f, and the input node of one of the inverters 411e/411f is connected to the output node of the other inverter 411f/411e so as to form a memory loop. The switching unit 411b is implemented by an n-channel enhancement type field effect transistor 411g. The n-channel enhancement type field effect transistor 411g is connected between the write-in signal line 511 and the input node of the memory circuit 411a, and the selecting signal line 501 is connected to the gate electrode of the n-channel enhancement type field effect transistor 411g. When the selecting signal line 501 is changed to the high level, the n-channel enhancement type field effect transistor 411g turns on so as to provide a conductive path from the write-in signal line 511 to the input node 411h of the memory circuit 411a, and the memory circuit 411a stores the potential level on the write-in signal line 511 at the input node 411h.

The other switching unit 411c is also implemented by an n-channel enhancement type field effect transistor 411j, and the n-channel enhancement type field effect transistor 411g is connected between an internal signal line 311c and the input node of the additional current driving circuit 411d. The output node 411m of the memory circuit 411a is connected to the gate electrode of the n-channel enhancement type field effect transistor 411j, and the n-channel enhancement type field effect transistor 411j is changed between on-state and off-state depending upon the potential level at the output node 411m. The additional current driving circuit 411d is implemented by an inverter 411n, and the additional current driving circuit 411d is coupled in parallel to the inverter 311b depending upon the potential level at the output node 411m of the memory circuit 411a.

If the write-in signal line 511 is in the high level during the on-state of the n-channel enhancement type field effect transistor 411a, the high level is propagated to the input node 411h, and the inverter 411e changes the output node 411m to the low level. The n-channel enhancement type field effect transistor 411j is turned off, and the input signal IN is never supplied to the input node of the inverter 411h. In this situation, the additional current driving circuit 411h does not cooperate with the current driving circuit 311a, and only the current driving circuit 311a produces the Output signal OUT. On the other hand, if the low level is stored in the memory circuit 411a, the output node 411m is changed to the high level, and causes the n-channel enhancement type field effect transistor 411j to turn on. As a result, the switching unit 411c propagates the input signal IN to the additional current driving circuit 411d, and the additional current driving circuit 411d cooperates with the current driving circuit 311a. In other words, the additional current driving circuit 311a enhances the current driving capability for the output signal OUT.

Description is hereinbelow made on the circuit behavior of the gate array with reference to FIG. 8 of the drawings. In the following description, only the standard cell 344 is required to increase the current driving capability through the cooperation with the additional current driver 444 in the fourth row, and the other standard cells 341, 342 and 343 produces the Output signals OUT without cooperation with the associated additional current drivers 441, 442 and 443.

The reset signal RST goes down to the low level at time t1, and the control signal CTL rises at time t2. The high level is transferred from the D flip flop circuit 34a toward the D flip flop circuit 34d in synchronism with the clock signal CLK. The write-in signal lines 511/512/513 are changed to the high level at time t3. However, the write-in signal line 514 remains low at time t3.

The T flip flop circuits 36a/36b of the clock divider 36 are also reset at time t1. Thereafter, the T flip flop circuit 36a produces the divided clock signal DCLK1 twice as long in pulse interval as the clock signal CLK, and the T flip flop circuit 36b produces the divided clock signal DCLK2 four times as long in pulse interval as the clock signal CLK, and the AND gate 36d produces the enable signal EBL at time t3. The enable signal EBL is supplied from the AND gate 36d to the decoding circuit 35c, and the decoding circuit 35c is enabled at time t3.

The D flip flop circuits 35a/35b of the selecting circuit 35 are also reset at time t1, and the selecting signal SEL causes the D flip flop circuits 35a/35b to change the output nodes 35g/35e to the high level at time t3. The decoding circuit 35c enabled with the enable signal EBL changes the selecting signal 504 to the high level at time t3, and keeps the other selecting signals 501/502/503 low.

The selecting signal line 504 at the high level causes the n-channel enhancement type field effect transistors 411g of the additional current drivers 441 to 444 to turn on, and the potential level on the write-in signal lines 511 to 514 are propagated to the memory circuits 411a. As described hereinbefore, the write-in signal lines 511 to 513 are in the high level, and only the write-in signal line 514 is in the low level. As a result, the memory circuits 411a of the additional current drivers 441, 442 and 443 changes the potential level at the output nodes 411m to the low level, and the memory circuit 411a of the additional current driver 444 changes the output node 411m to the high level.

The n-channel enhancement type field effect transistors 411j of the additional current drivers 441 to 443 are turned off, and only the n-channel enhancement type field effect transistor 411j of the additional current driver 444 turns on so as to provide a signal path from the internal signal line 311c of the standard cell 344 to the additional current driving circuit 411d. When the additional current drivers 441 to 444 are selectively activated, the clock signal CLK is removed at time t4, and the reset signal RST is changed to the active high level. As a result, the selecting signal lines 501 to 504 are recovered to the low level, and all the write-in signal lines 511 to 514 are changed to the low level. However, the potential levels on the write-in signal lines 511 to 514 are still stored in the memory circuits 411a.

After completion of the write-in, the manufacturer carries out the LSI tests, and any logical discrepancy due to the signal delay does not take place between the back annotation and the LSI tests.

Figure 12:
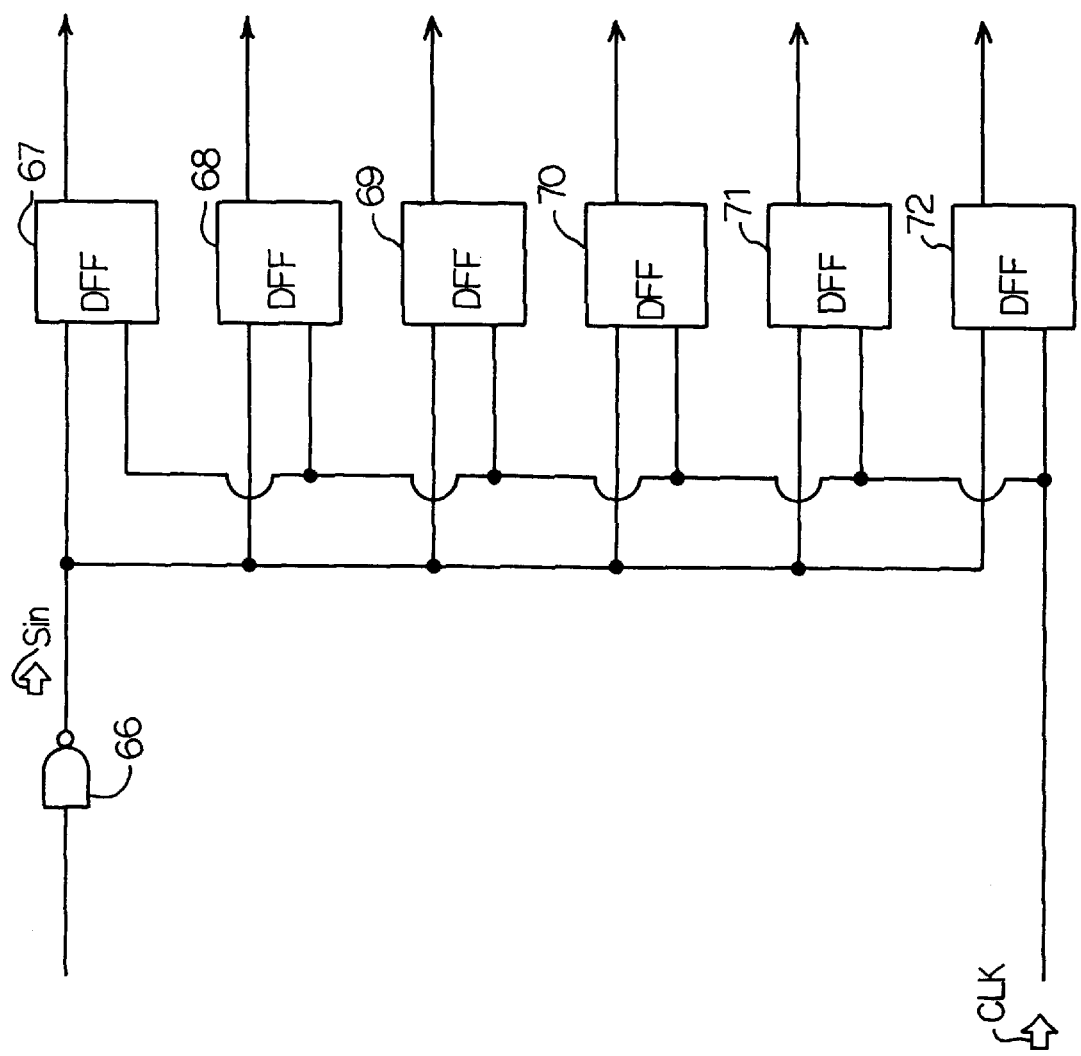
FIG. 12 is a circuit diagram showing the circuit configuration of a first fan-out dependent circuit.
Figure 13:
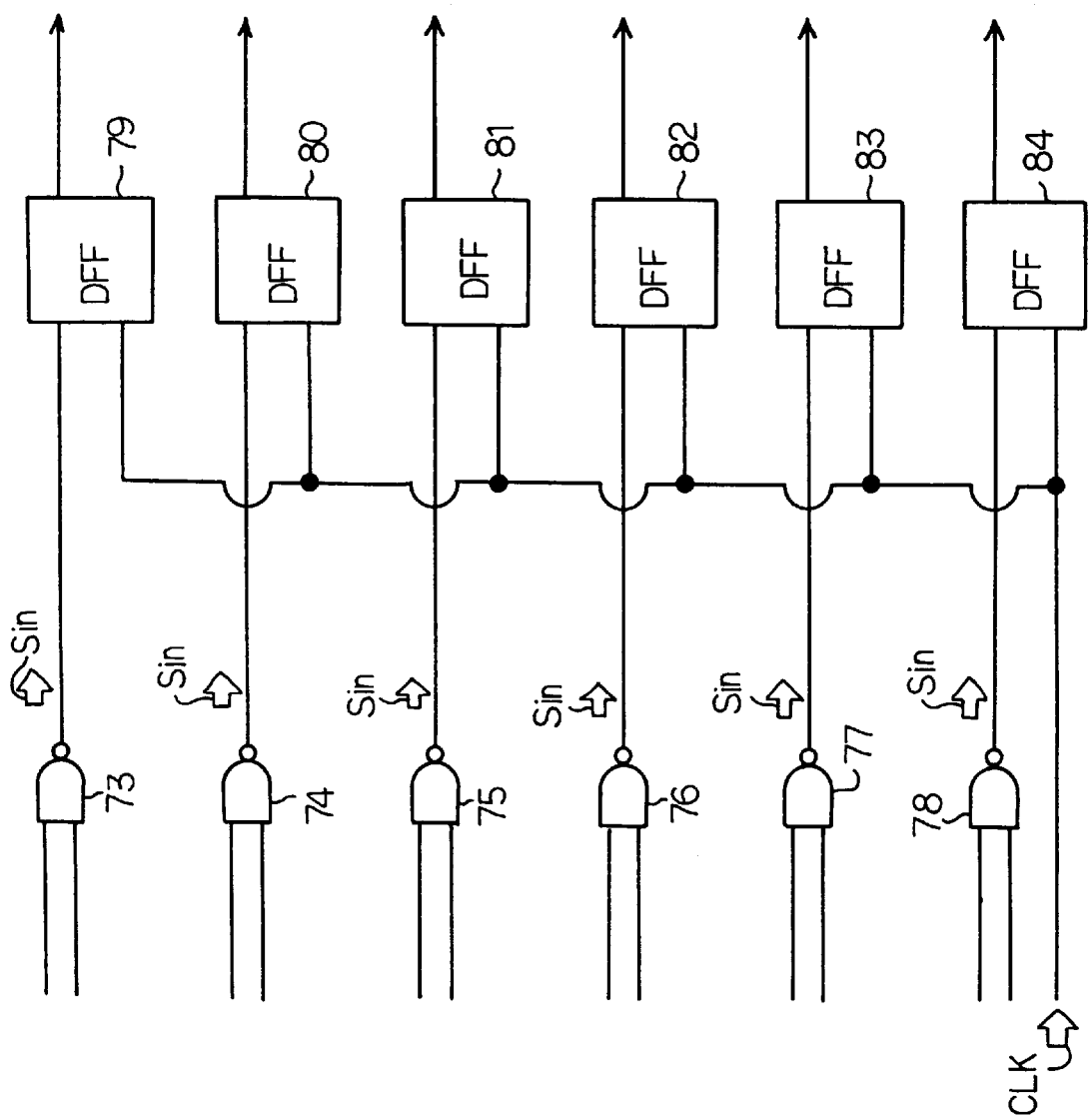
FIG. 13 is a circuit diagram showing the circuit configuration of a second fan-out dependent circuit.

Description is hereinbelow made on the dependency of time delay on the current driving capability. FIGS. 12 and 13 illustrate examples of a fan-out dependent circuit. The first example shown in FIG. 12 includes a NAND gate 66 and six D flip flop circuits 67 to 72. The NAND gate 66 supplies an input data signal Sin to the input data nodes of all the D flip flop circuits 67 to 72. On the other hand, the second example includes six NAND gates 73 to 78, which respectively supply the input data signals Sin to associated D flip flop circuits 79 to 84. The NAND gates 66 and 73–78 are assumed to have a large current driving capability or a small current driving capability. Term "fan-out" is hereinbelow abbreviated as F/O.

These examples have the following coefficients.
1) Internal time delay (Tpd0) of NAND gate with a large driving capability: 0.156
2) Wire delay coefficient (T0) of NAND gate with a large driving capability: 0.03
3) Wire capacitance (I0) in case of F/O of 6: 18.529
4) Internal time delay (Tpd1) of NAND gate with a small driving capability: 0.169
5) Wire delay coefficient (T1) of NAND gate with a small driving capability: 0.059
6) Wire capacitance (I1) in case of F/O of 1: 2.838

In the first example shown in FIG. 12, if the NAND gate 66 has the large current driving capability or the small current driving capability, time delay Tpd–L or Tpd–S on the wiring is given by equation 1.

$$Tpd\text{-}L \text{ (or } Tpd\text{-}S) = Tpd0 \text{ (or } Tpd1) + (F/O + I0 \text{ (or } I1)) \times T0 \text{ (or } T1) \quad \text{equation 1}$$

When the NAND gate has the large current driving capability, the time delay Tpd–L is calculated as $$Tpd\text{-}L = 0.0156 + (6+18.529) \times 0.03 = 0.892 \text{ (ns)}$$

$$Tpd\text{-}S = 0.169 + (6+18.529) \times 0.059 = 1.616 \text{ (ns)}$$

On the other hand, the NAND gates 73 to 78 respectively supply the input data signals Sin to the associated D flip flop circuits 79 to 84, and fan-out is 1. The time delay is given as $$Tpd\text{-}L = 0.156 + (1+2.838) \times 0.03 = 0.271 \text{ (ns)}$$

$$Tpd\text{-}S = 0.169 + (1+2.838) \times 0.059 = 0.395 \text{ (ns)}$$

Comparing Tpd–L and Tpd–S at F/O=6 with Tpd–L and Tpd–S at F/O=1, it is understood that the influence of the driving capability is serious on the large fan-out rather than the small fan-out. In detail, when the fan-out is 6, the NAND gate with the small current driving capability prolongs the time delay 1.81 times longer than the time delay of the NAND gate with the large current driving capability. On the other hand, when the fan-out is 1, the NAND gate with the small current driving capability prolongs the time delay only 1.46 times longer than the time delay of the NAND gate with the small current driving capability.

Using the above described feature, it is possible to regulate the timings for the clock signal in a sequence circuit. When the current driving capability for a function block is changed, the time delay is varied. If the current driving capability is large, the time delay is shrunk. In this way, the signal delay in the LSI tests is changed so as to match the results in the back annotation with the results in the LSI tests.

In this instance, the selecting signal lines 501 to 504, the write-in signal lines 511 to 514, the controlling circuit 34, the clock divider 36 and the selecting circuit 35 as a whole constitute a peripheral circuit. The D flip flop circuits 35a/35b serve as a signal pattern generator, and the clock divider 36 serves as a control signal generator.

As will be appreciated from the foregoing description, a selected additional current driver 411 to 444 increases the current driving capability of the associated standard cell 311 to 344, and cancels the time delay due to the difference in load. As a result, the manufacturer can confirm the designed logical functions through the LSI tests, and does not need to redesign.

Second Embodiment

Figure 14:
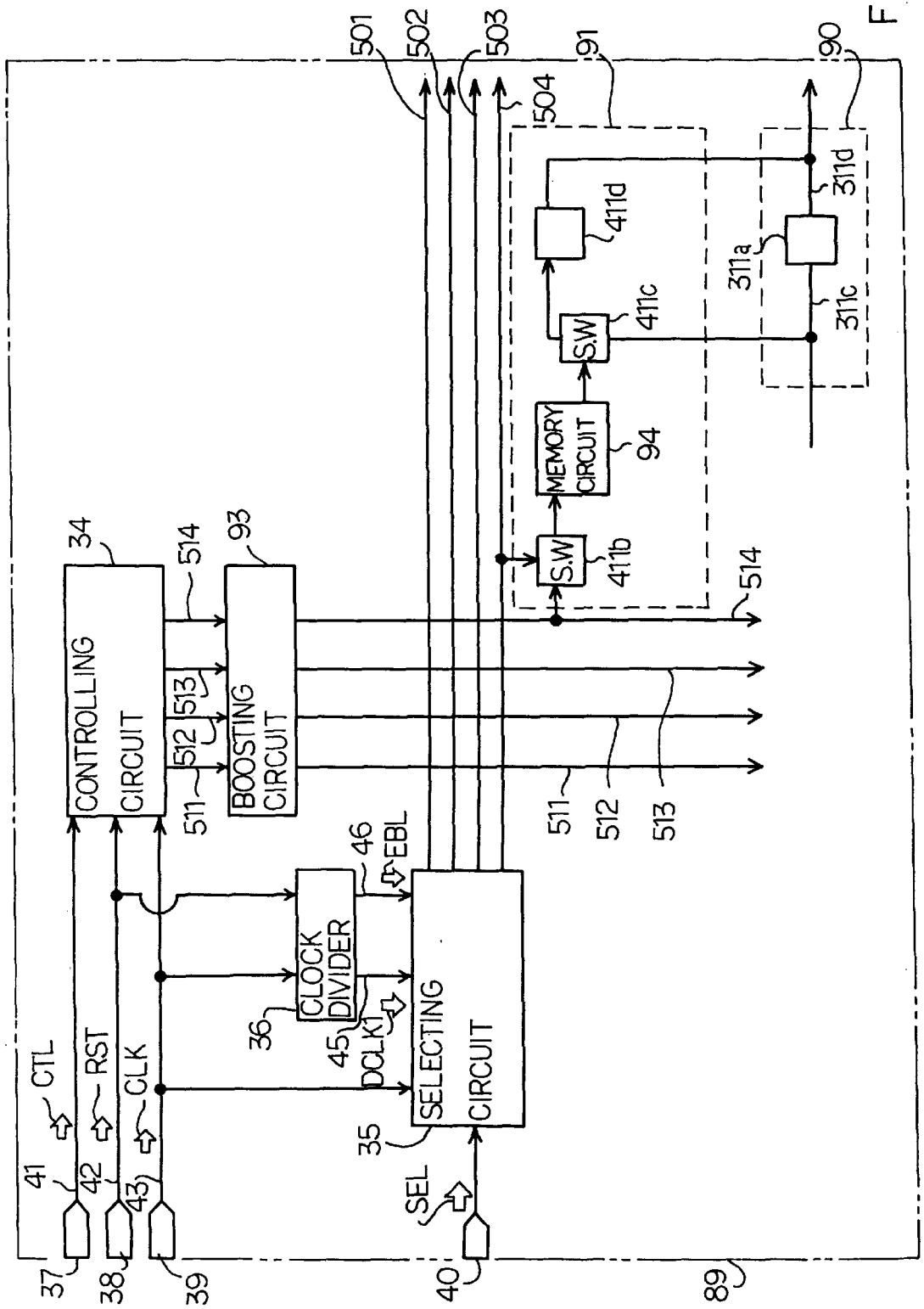
FIG. 14 is a circuit diagram showing the circuit configuration of another gate array according to the present invention.

FIG. 14 illustrates another semiconductor wafer 89 serving as a master-slice for semi-custom-made integrated circuit devices produced from a gate array. Although only one standard cell 90 is shown in FIG. 14, the standard cells are arranged in rows and columns as similar to the first embodiment, and additional current drivers 91 are respectively associated with the standard cells 90. The semiconductor wafer 89 serving as a master-slice is similar to the first embodiment except for a boosting circuit 93 and a memory circuit 94 of each additional current driver 91, and components on the semiconductor wafer 89 are labeled with the same references designating corresponding components of the first embodiment.

The boosting circuit 34 is connected to the write-in signal lines 511, 512, 513 and 514, and the memory circuit 94 is implemented by an electrically erasable read only memory cell. In this instance, the electrically erasable read only memory cell is implemented by a floating gate type field effect transistor. The control signal lines 511 to 514 are associated with the columns of additional current drivers, and supply write-in potential to the control gate electrodes of the associated electrically erasable read only memory cells. The memory circuit 94 is desirable, because the write-in data is not lost after power-off.

The electrically erasable read only memory cell is changed between the erased state and write-in state, and changes the threshold depending upon the current state. The memory circuit 94 supplies either high or low potential level to the second switching unit 411c so as to provide a signal path from the internal signal line 311c to the additional current driving circuit 411d.

In this instance, the selecting signal lines 501 to 504, the write-in signal lines 511 to 514, the controlling circuit 34, the clock divider 36, the selecting circuit 35 and the boosting circuit 93 as a whole constitute a peripheral circuit. The second embodiment achieves all the advantages of the first embodiment.

Although particular embodiments of the present invention have been shown and described, it will be obvious to those skilled in the art that various changes and modifications may be made without departing from the spirit and scope of the present invention.

What is claimed is:

1. A semiconductor wafer serving as a master-slice for semi-custom-made integrated circuit devices, comprising:

a plurality of standard cells available for forming an integrated circuit and having respective associated signal drivers;

a plurality of additional signal drivers respectively associated with said plurality of standard cells, and having respective input signal lines connected to signal input nodes of said associated signal drivers of said plurality of standard cells and respective output signal lines connected to signal output nodes of said associated signal drivers; and a peripheral circuit selectively activating said plurality of additional signal drivers so that selected additional signal drivers cooperate with the associated signal drivers.

2. The semiconductor wafer as set forth in claim 1, in which said peripheral circuit includes:

a plurality of selecting signal lines selectively connected to said plurality of additional signal drivers for specifying said selected additional signal drivers, a plurality of write-in signal lines selectively connected to said plurality of additional signal drivers for supplying an instruction for cooperation with the associated signal drivers to said selected additional signal drivers, a controlling circuit responsive to a control signal so as to selectively change said plurality of write-in signal lines to a first potential level representative of said instruction, and a selecting unit responsive to a selecting signal so as to selectively change said plurality of selecting signal lines to a second potential level representative of said selected additional signal drivers.

3. The semiconductor wafer as set forth in claim 2, in which said selecting unit includes:

a control signal generator connected to signal terminals assigned to receive external signals and responsive to said external signals so as to produce a timing signal and an enable signal, a signal pattern generator connected to said control signal generator and responsive to said selecting signal so as to change a signal pattern in response to said timing signal, and a decoding circuit connected between said signal pattern generator and said plurality of selecting signal lines and enabled with said enable signal for selectively changing said plurality of selecting signal lines to said second potential level.

4. The semiconductor wafer as set forth in claim 2, in which said selecting unit includes:

a control signal generator connected to signal terminals assigned to external signals and responsive to said external signals so as to produce a timing signal and an enable signal, a signal pattern generator connected to said control signal generator and responsive to said selecting signal so as to change a signal pattern in response to said timing signal, and a decoding circuit connected between said signal pattern generator and said plurality of selecting signal lines and enabled with said enable signal for selectively changing said plurality of selecting signal lines to said second potential level, and wherein each of said plurality of additional signal driver includes:

a memory circuit for storing said instruction, a first switching unit connected between the associated write-in signal line and said memory circuit and responsive to said second potential level on the associated selecting signal line for providing a signal path from said associated write-in signal line to said memory circuit, an additional signal driving circuit having an input node and an output node connected to said signal input and output node respectively of the associated signal driver, and a second switching unit connected between said signal input node of said associated signal driver and said input node of said additional signal driving circuit and responsive to said instruction stored in said memory circuit so as to provide a signal path between said signal input node of said associated signal driver and said input node of said additional signal driver.

5. The semiconductor wafer as set forth in claim 4, in which said memory circuit is implemented by a two-stable circuit.

6. The semiconductor wafer as set forth in claim 5, in which said two-stable circuit is implemented by two inverters each having an output node connected to an input node of the other inverter.

7. The semiconductor wafer as set forth in claim 4, in which said memory circuit is implemented by an electrically erasable read only memory cell, and said peripheral circuit further includes a boosting circuit connected to said plurality of write-in signal lines so as to boost up said first potential level to a write-in potential level so as to a change current status of said electrically erasable read only memory cell.

8. The semiconductor wafer as set forth in claim 4, in which said control signal generator is implemented by a clock divider, and said clock divider produces said timing signal and said enable signal from one of said external signals serving as a clock signal.

9. The semiconductor wafer as set forth in claim 8, in which said clock divider includes a first trigger flip flop circuit having a clock input node connected to a signal terminal assigned to said clock signal and a reset node connected to a signal terminal assigned to another external signal serving as a reset signal for producing said timing signal at an output node thereof, a second trigger flip flop circuit having a clock input node connected to said output node of said first trigger flip flop circuit and a reset node connected to said signal terminal assigned to said another external signal, a NOR gate having input nodes connected to said output node of said first trigger flip flop circuit and an output node of said second trigger flip flop circuit, and an AND gate having a first input node connected to an output node of said NOR gate and a second input node connected to said signal terminal assigned to said clock signal for producing said enable signal at an output node thereof.

10. The semiconductor wafer as set in claim 3, in which said signal pattern generator includes:

a first delayed flip flop circuit having an input node connected to the signal terminal assigned to said selecting signal, a reset node connected to the external terminal assigned to the external signal serving as a reset signal and a clock node supplied with said timing signal, a second delayed flip flop circuit having an input node connected to an output node of said first delayed flip flop circuit, a reset node connected to the said signal terminal assigned to said reset signal and a clock node supplied with said timing signal, and wherein said signal pattern is produced at the output node of said first delayed flip flop circuit and an output node of said second delayed flip flop circuit.

11. The semiconductor wafer as set forth in claim 2, in which said controlling circuit includes a plurality of delayed flip flop circuits arranged in cascade and having respective output nodes connected to said plurality of write-in signal lines.

* * * * *